(12) United States Patent
Fu et al.

(10) Patent No.: US 9,412,656 B2
(45) Date of Patent: Aug. 9, 2016

(54) REVERSE TONE SELF-ALIGNED CONTACT

(71) Applicant: Taiwan Semiconductor Manufacturing Co., Ltd., Hsin-Chu (TW)

(72) Inventors: Ching-Feng Fu, Taichung (TW); Yu-Chan Yen, Taipei (TW); Chia-Ying Lee, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 72 days.

(21) Appl. No.: 14/180,460

(22) Filed: Feb. 14, 2014

(65) Prior Publication Data

US 2015/0235897 A1    Aug. 20, 2015

(51) Int. Cl.
| | |
|---|---|
| *H01L 21/32* | (2006.01) |
| *H01L 21/44* | (2006.01) |
| *H01L 21/768* | (2006.01) |
| *H01L 29/417* | (2006.01) |
| *H01L 29/423* | (2006.01) |
| *H01L 29/66* | (2006.01) |
| *H01L 21/3105* | (2006.01) |
| *H01L 29/78* | (2006.01) |
| *H01L 29/165* | (2006.01) |

(52) U.S. Cl.
CPC .... *H01L 21/76879* (2013.01); *H01L 21/31055* (2013.01); *H01L 21/76897* (2013.01); *H01L 29/165* (2013.01); *H01L 29/4175* (2013.01); *H01L 29/41783* (2013.01); *H01L 29/42364* (2013.01); *H01L 29/6681* (2013.01); *H01L 29/66545* (2013.01); *H01L 29/66606* (2013.01); *H01L 29/78* (2013.01); *H01L 29/7848* (2013.01)

(58) Field of Classification Search
CPC ............... H01L 21/76879; H01L 29/4175; H01L 29/42364; H01L 29/6681; H01L 21/76897; H01L 29/41783; H01L 29/66545; H01L 29/66606; H01L 29/78; H01L 29/7848; H01L 29/165
See application file for complete search history.

(56) References Cited

U.S. PATENT DOCUMENTS

| | | | | |
|---|---|---|---|---|
| 7,687,395 | B2 * | 3/2010 | Yang ................ | H01L 21/76897 257/E21.577 |
| 8,367,493 | B1 * | 2/2013 | Ngo .................... | H01L 23/291 257/315 |
| 8,481,415 | B2 * | 7/2013 | Yuan ................. | H01L 21/76897 438/183 |
| 8,741,723 | B2 * | 6/2014 | Chi ..................... | H01L 29/665 438/299 |
| 8,772,102 | B2 * | 7/2014 | Chi ..................... | H01L 29/665 438/229 |

(Continued)

*Primary Examiner* — Savitr Mulpuri
(74) *Attorney, Agent, or Firm* — Eschweiler & Associates, LLC

(57) ABSTRACT

Some embodiments of the present disclosure relate to a method to form a source/drain self-aligned contact to a transistor or other semiconductor device. The method comprises forming a pair of gate structures over a substrate, and forming a source/drain region between the pair of gate structures. The method further comprises forming a sacrificial source/drain contact which is arranged over the source/drain region and which is arranged laterally between neighboring sidewalls of the pair of gate structures. The method further comprises forming a dielectric layer which extends over the sacrificial source/drain contact and over the pair of gate structures. The dielectric layer differs from the sacrificial source/drain contact. The method further comprises removing a portion of the dielectric layer over the sacrificial source/drain contact and subsequently removing the sacrificial source/drain contact to form a recess, and filling the recess with a conductive material to form a source/drain contact.

20 Claims, 16 Drawing Sheets

(56) References Cited

U.S. PATENT DOCUMENTS

| | | | |
|---|---|---|---|
| 8,828,813 B2 * | 9/2014 | Huang | H01L 29/0847 257/E21.444 |
| 8,987,136 B2 * | 3/2015 | Zhong | H01L 29/78 438/149 |
| 2013/0157450 A1 * | 6/2013 | Fitz | H01L 21/76897 438/586 |
| 2015/0021683 A1 * | 1/2015 | Xie | H01L 29/6653 257/330 |
| 2015/0064863 A1 * | 3/2015 | Adusumilli | H01L 21/283 438/229 |
| 2015/0069532 A1 * | 3/2015 | Xie | H01L 29/66545 257/410 |
| 2015/0187905 A1 * | 7/2015 | Cai | H01L 29/6681 257/288 |

* cited by examiner

REVERSE TONE SELF-ALIGNED CONTACT

BACKGROUND

The following disclosure relates to semiconductor manufacturing methods. In particular, the following disclosure relates to method for forming a contact to a semiconductor device.

For advanced semiconductor nodes, the scaling of devices in accordance with Moore's Law has driven the contacted poly pitch (CPP) (i.e., the minimum center-to-center space between gates of adjacent transistors) to less than about 100 nm. As a result, contacts to the source or drain of such transistors must fit within the remaining space between adjacent gates without shorting the gate to the drain. To achieve this, methods such as double or triple-patterning of source/drain contacts have been utilized.

Multiple-patterning techniques require additional masks and manufacturing overhead over single-patterning techniques. Moreover, the use of additional masks reduces overlay (OVL) control between source/drain contacts, the source or drain to which the contact aligns, and adjacent features such as the gate of the transistor from which the contact must remain electrically isolated to insure yield. Other techniques such as self-aligned contact formation can reduce OVL degradation associated with multiple-patterning techniques, but require additional layers in the transistor device stack form proper contact formation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
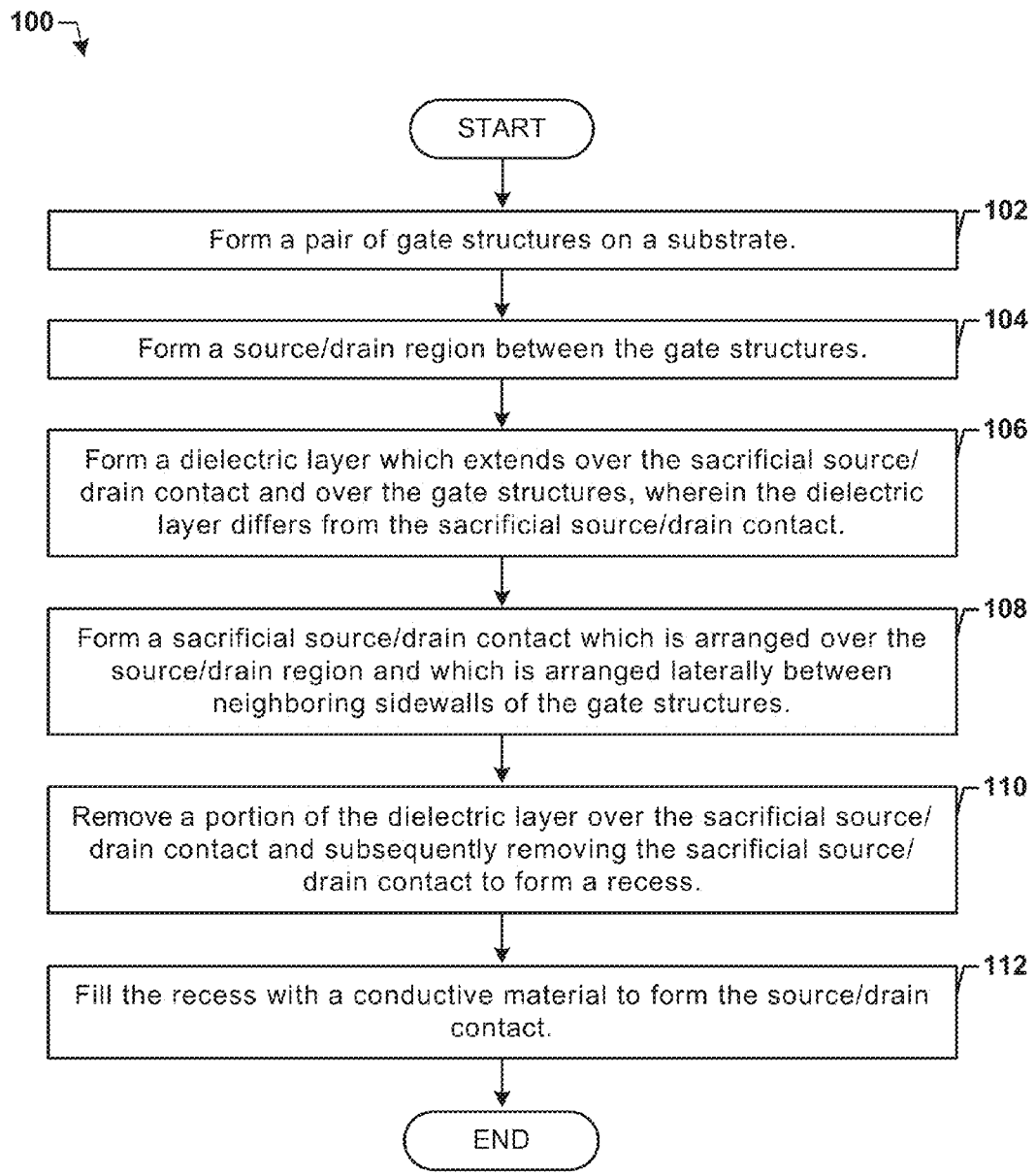
FIG. 1 illustrates some embodiments of a method of forming a source/drain contact.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over," "on," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some methods of self-aligned contact formation to a source/drain of a transistor utilize a hard mask to form an opening for the self-aligned contact through an inter-layer dielectric (ILD) formed over the transistor. The opening is etched to form a recess within the ILD, which is then filled with a conductive material to form the self-aligned contact. Prior to ILD formation, an insulating material is formed over a gate of the transistor. The insulating material isolates the gate from the source/drain self-aligned contact. The insulating material also serves as an etch stop material during the source/drain recess etch to prevent the etch from exposing the gate to the recess and thus creating an electrical short between the self-aligned contact and gate.

The source/drain recess etch is a selective etch, which utilizes an etchant with a high degree of selectivity between the insulating material and the ILD, such that it etches the ILD at a substantially higher rate than the insulating material. As a result, the ILD may be etched completely away while the insulating material is left substantially intact, thus keeping the gate electrically isolated (i.e., not touching) the recess. However, while the insulating material is etched at a substantially slower rate than the ILD, it is still etched. In addition, hard mask misalignment due to poor overlay (OVL) control may cause the opening of the hard mask to shift from the over the source/drain of the transistor to over the gate. Due to the misalignment, the insulating material over the gate (particularly at the corner of the gate) is exposed to more etchant than intended by the nominal etching process, and is subsequently etched more than intended. This can expose the gate to the recess. As a result, the source/drain self-aligned contact will contact the gate, and thus electrically short to the gate, when the recess is filled with the conducting material.

Accordingly, some embodiments of the present disclosure relate to a method to form a source/drain self-aligned contact to a transistor or other semiconductor device. FIG. 1 illustrates some embodiments of a method 100, which uses a sacrificial contact as an intermediate step to form a source/drain contact. At 102 a pair of gate structures are formed on a substrate. At 104 a source/drain region is formed between the gate structures. At 106 a sacrificial source/drain contact is formed. The sacrificial source/drain contact is arranged over the source/drain region and which is arranged laterally between neighboring sidewalls of the gate structures. At 108 a dielectric layer is formed which extends over the sacrificial source/drain contact and over the gate structures. The dielectric layer differs from the sacrificial source/drain contact. At 110 a portion of the dielectric layer over the sacrificial source/drain contact is removed, and subsequently the sacrificial source/drain contact is removed to form a recess. At 112 the recess is filled with a conductive material to form the source/drain contact.

Figure 1A:
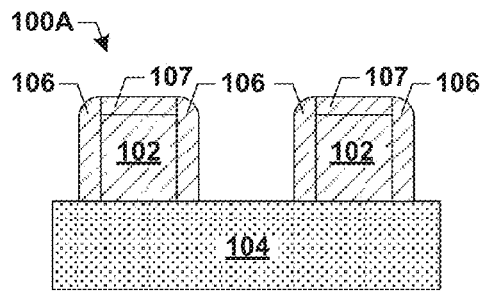
FIGS. 1A-1F illustrate a series of cross-sectional views that collectively depict some embodiments of forming a source/drain contact.

FIGS. 1A-1F illustrate a series of cross-sectional views that collectively depict some embodiments of the formation of the source/drain contact in FIG. 1. In FIG. 1A, a pair of gate structures 102 formed on a substrate 104. Each gate structure 102 comprises insulating sidewall spacers 106 arranged about opposing sidewalls of the gate structure 102, and a capping layer 107 over its top surface. In some embodiments, each gate structure 102 further comprises a capping layer overlying an upper surface of the gate structure 102.

Figure 1B:
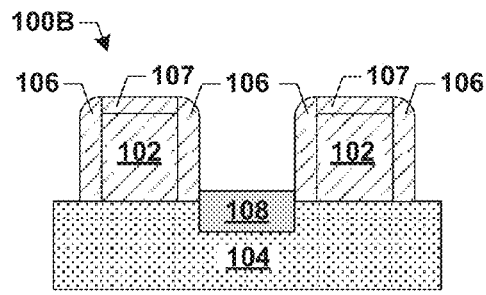

In FIG. 1B, a source/drain region 108 has been formed between the gate structures 102 of FIG. 1A. In some embodiments, formation of the source/drain region 108 comprises an implant of the substrate 104. In some embodiments, formation of the source/drain region 108 comprises recessing the substrate 104 and forming a strained source/drain region 108, comprising a material undergoing epitaxial strain, within the recessed area of the substrate 104.

Figure 1C:
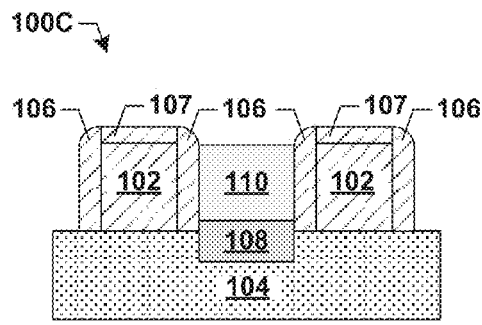

In FIG. 1C, a sacrificial source/drain contact 110 has been formed between the gate structures 102 of FIG. 1B. The sacrificial source/drain contact 110 is arranged over the source/drain region 108 and is arranged laterally between neighboring sidewalls 106 of the gate structures 102. In some embodiments, the sacrificial source/drain contact 110 comprises a conductive material, such as amorphous silicon.

Figure 1D:
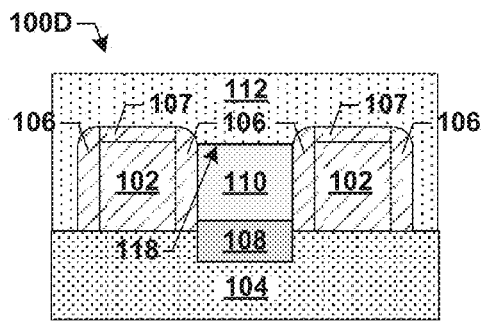

In FIG. 1D, a dielectric layer 112 has been formed over the gate structures 102 of FIG. 1C. The dielectric layer 112 extends over the sacrificial source/drain contact 110 and over the gate structures 102. The dielectric layer 112 differs from the sacrificial source/drain contact 110 (e.g., different material type, composition, structure, etc.). The sacrificial source/drain contact 110 and dielectric layer 112 meet at an interface 118 that lies on a plane, which intersects upper sidewall portions of the gate structure.

Figure 1E:
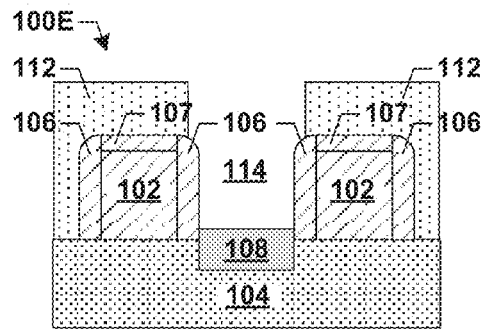

In FIG. 1E, a recess 114 has been formed between the gate structures 102 of FIG. 1D. In some embodiments, formation of the recess 114 comprises a two-step etch comprising a first etch that removes a portion of the dielectric layer 112 over the sacrificial source/drain contact 110, and a second etch that subsequently removes the sacrificial source/drain contact 110. In some embodiments, the second etch is selective etch that removes the sacrificial source/drain contact 110 while leaving the pair of gate structures 102 substantially un-etched. This two-step etch, in particular the selective second etch, has an advantage over some conventional approaches that the material of the sacrificial source/drain contact 110 allows for a high degree of etch selectivity (i.e., 5× to 10×) between the material of the sacrificial source/drain contact 110 and the gate structures 102. This high degree of etch selectivity prevents the insulating sidewall spacers 106 and capping layer 107 from being over-etched, and thus prevent shorts between a conducting body within the gate structures 102 and source/drain contact 116 formed in FIG. 1F.

Figure 1F:
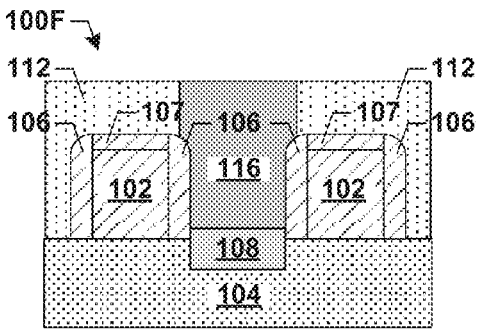

In FIG. 1F, the source/drain contact 116 has been formed within the recess 114 of FIG. 1E. The source/drain contact 116 comprises a conductive material (e.g., cobalt, copper, or tungsten). The source/drain contact 116 formed by the collective embodiments of FIGS. 1A-1F avoids the shorting problem to the gate structures 102 of some conventional approaches due to the second etch of FIG. 1F.

Figure 2A:
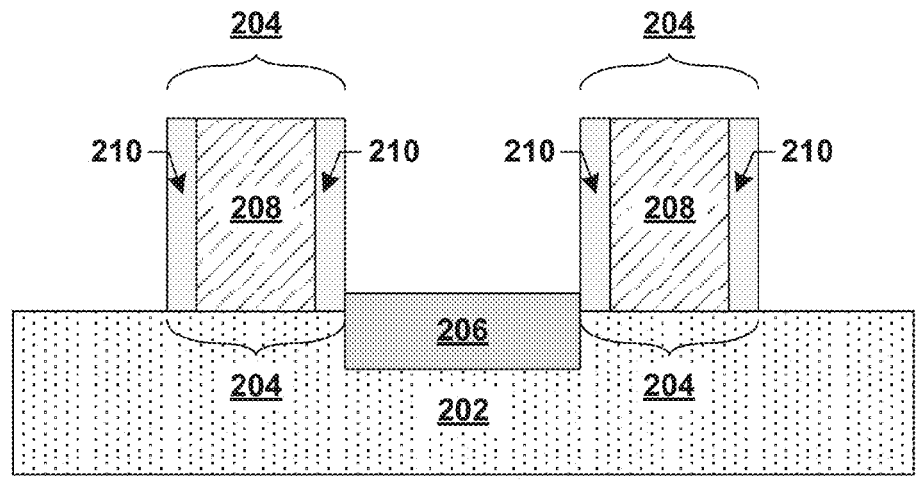
FIGS. 2A-2X illustrate a series of cross-sectional views that collectively depict some embodiments of forming a source/drain contact.
Figure 2B:
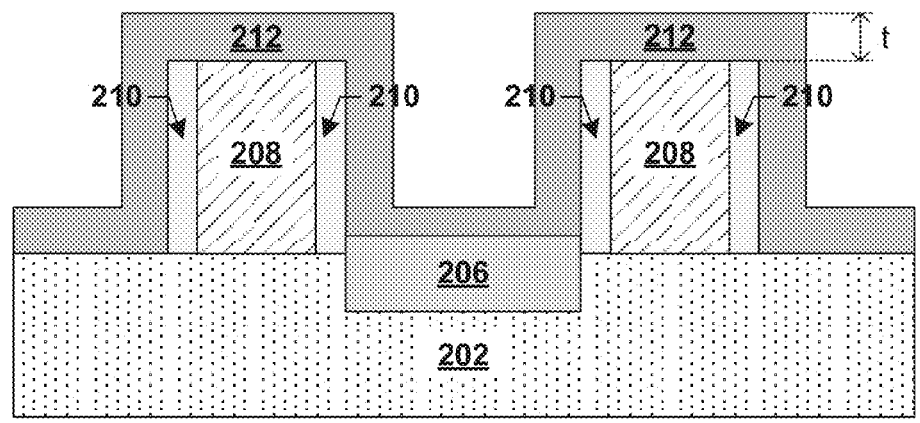
Figure 2C:
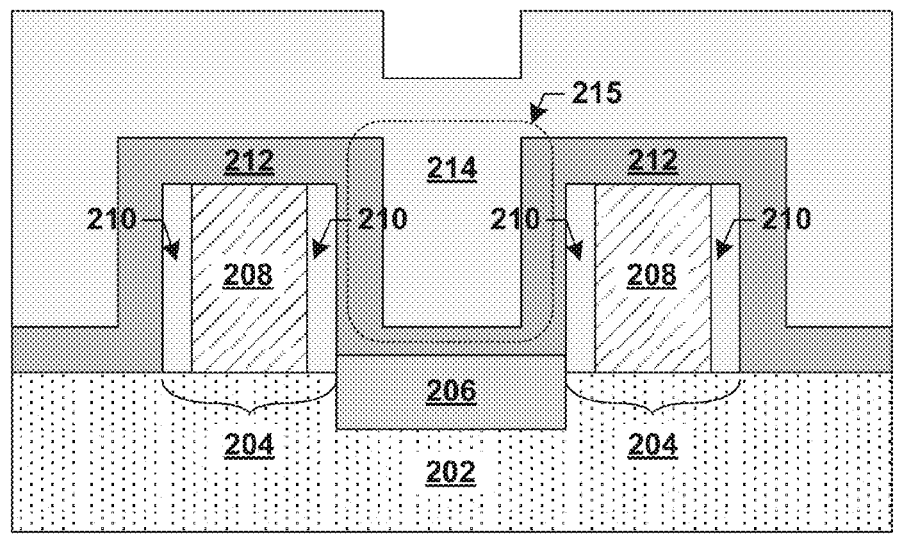
Figure 2D:
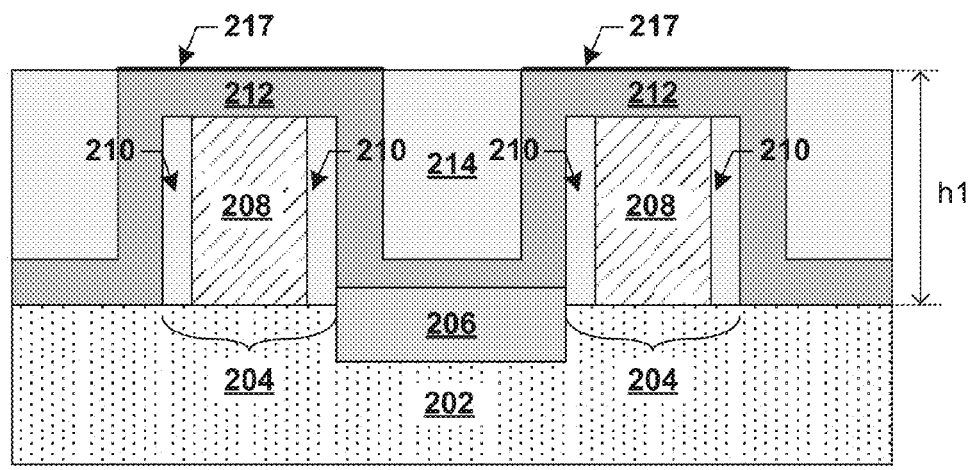
Figure 2E:
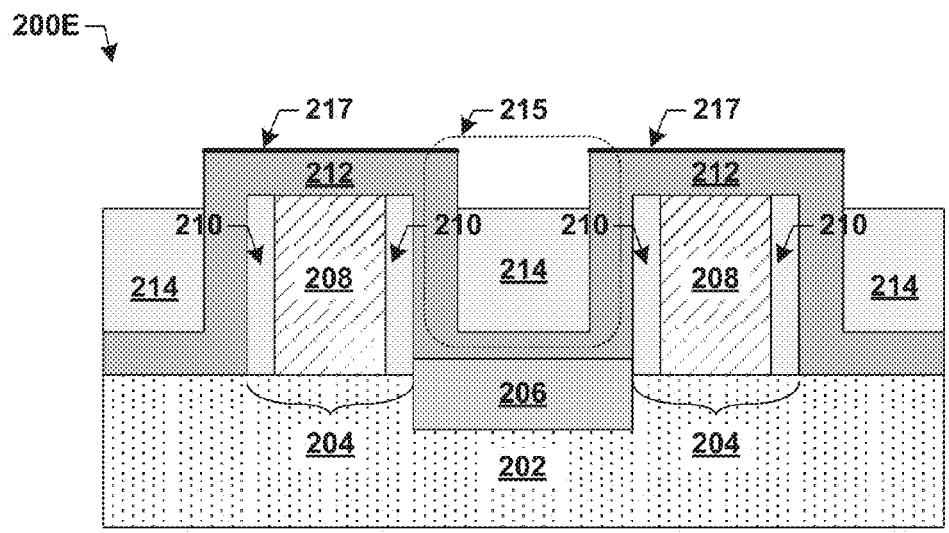
Figure 2F:
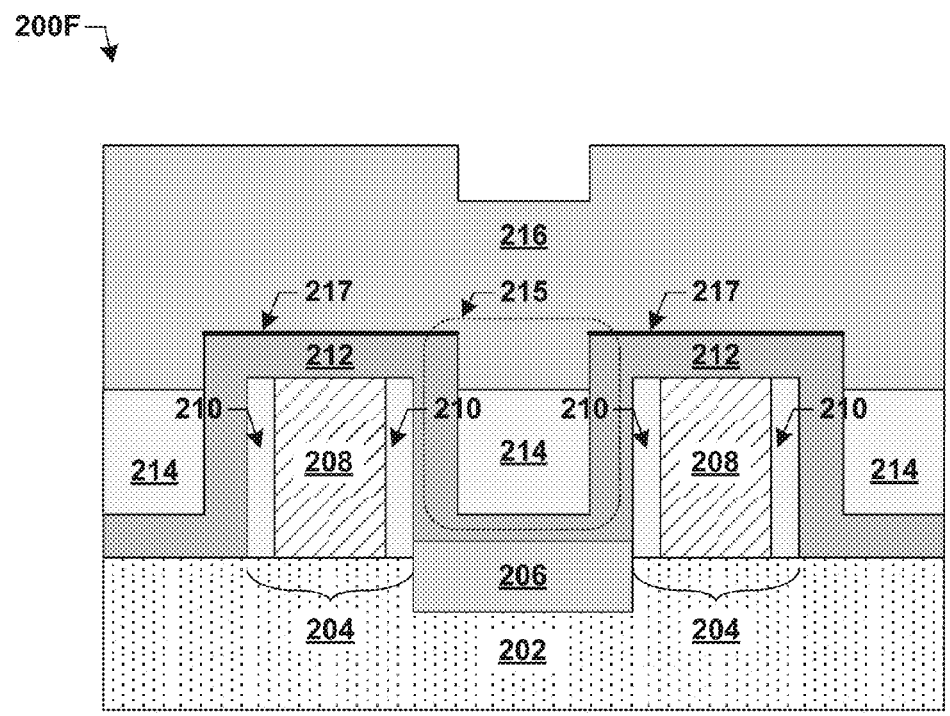
Figure 2G:
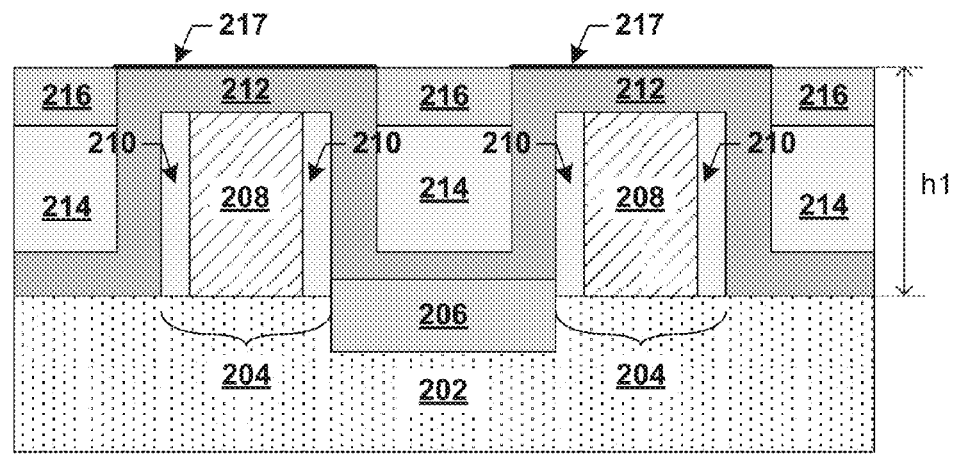
Figure 2H:
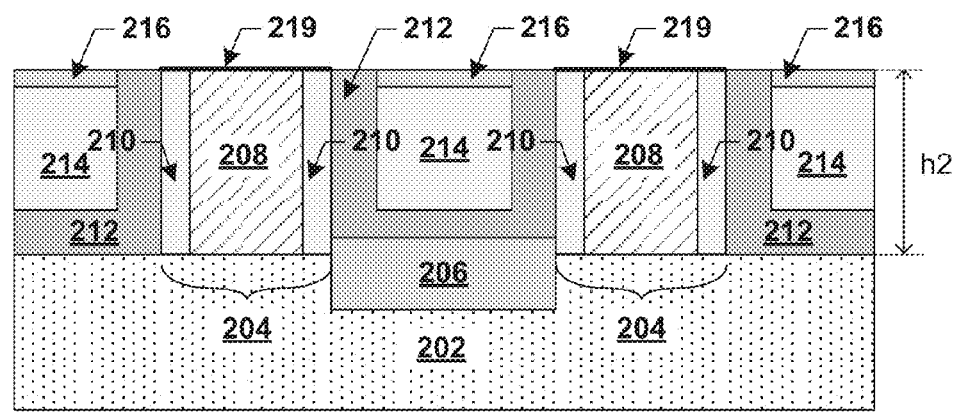
Figure 2I:
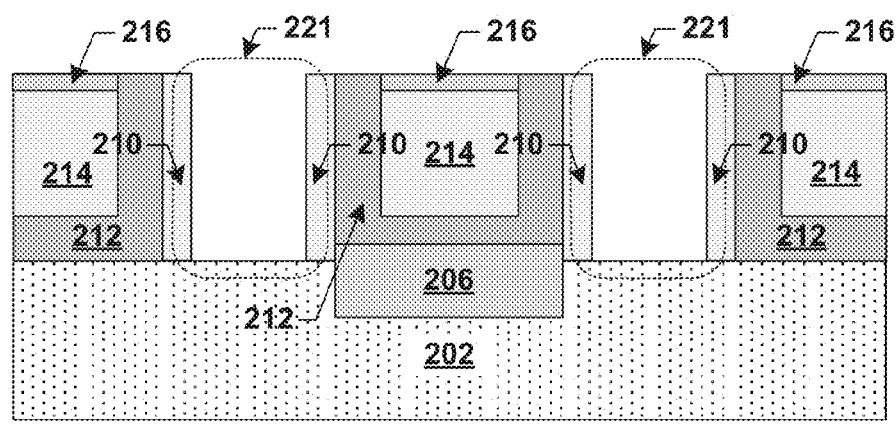
Figure 2J:
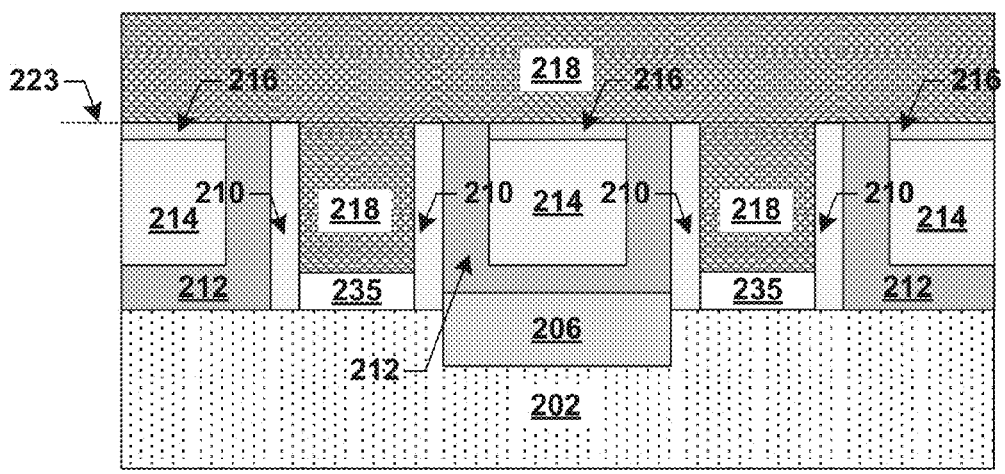
Figure 2K:
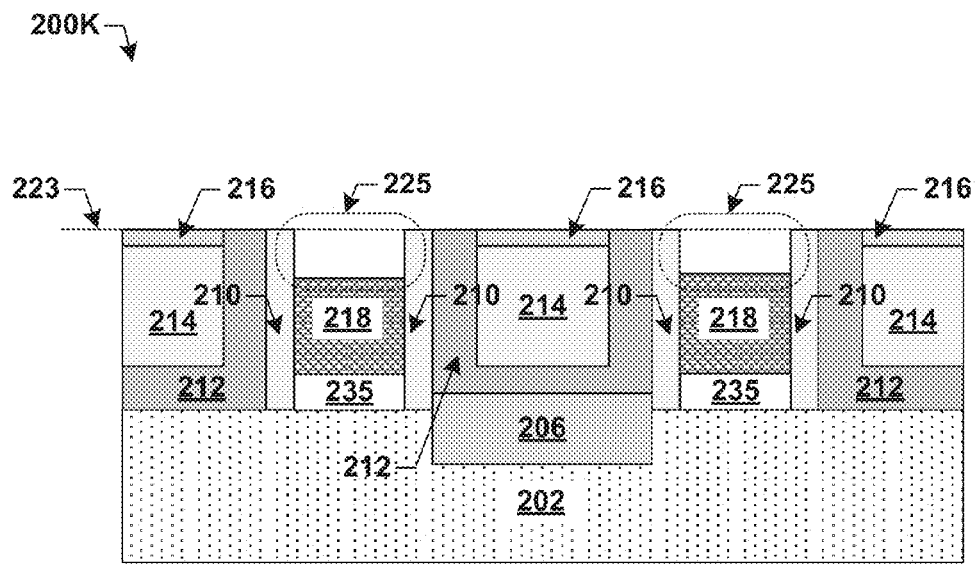
Figure 2L:
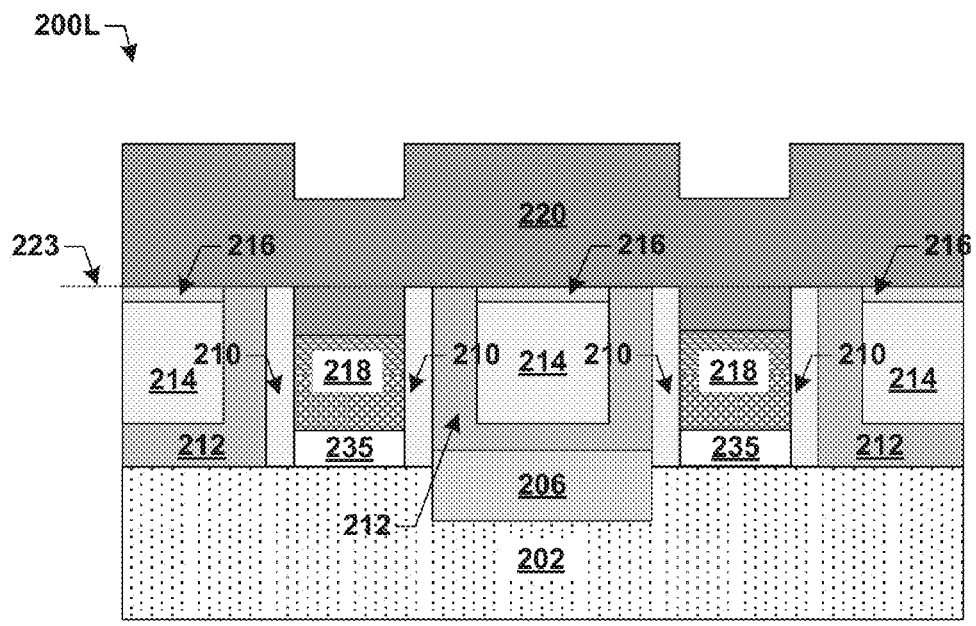
Figure 2M:
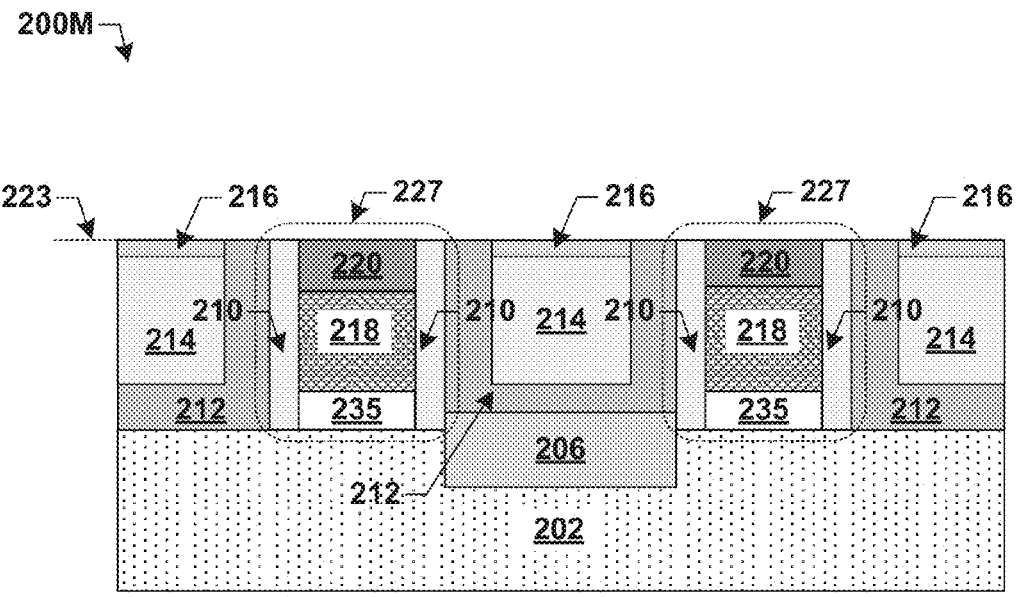
Figure 2N:
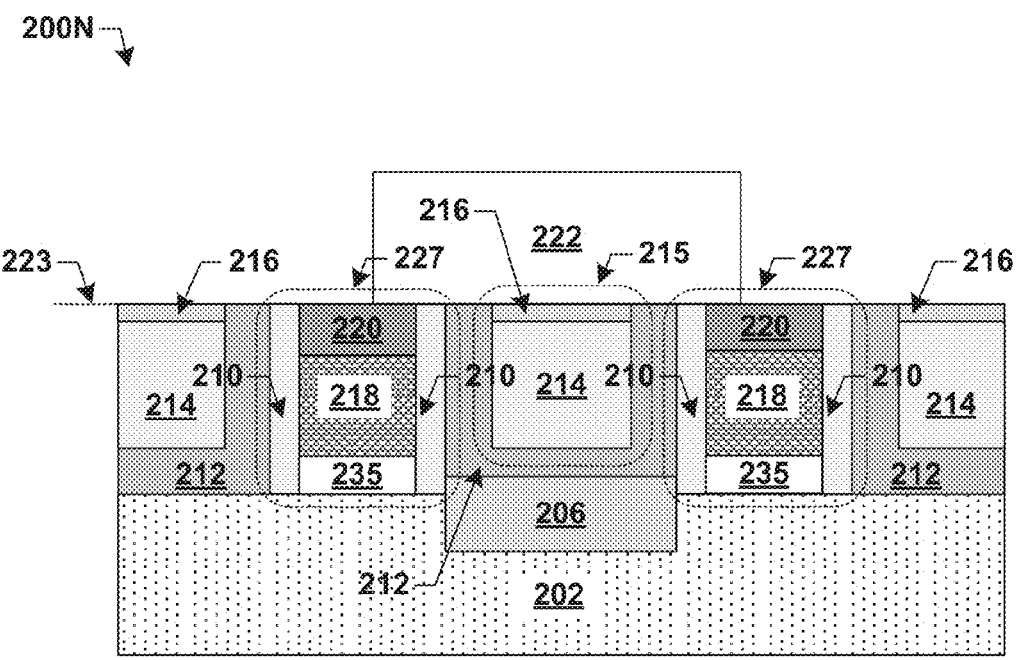
Figure 2O:
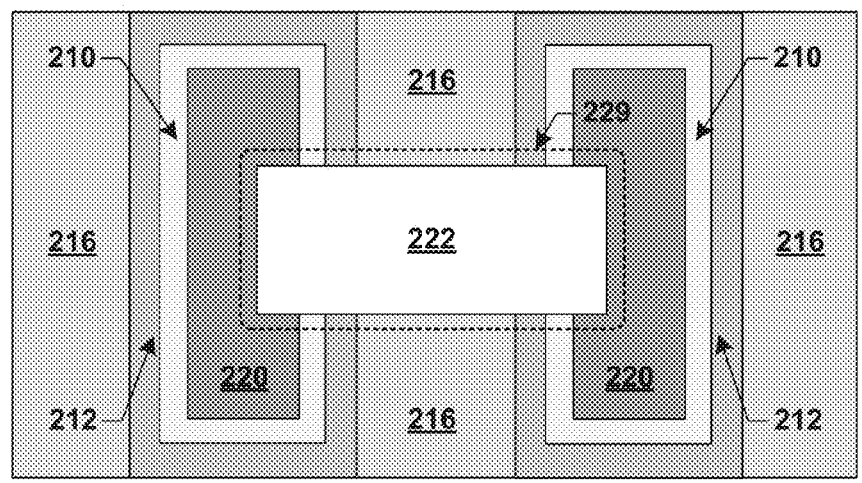
Figure 2P:
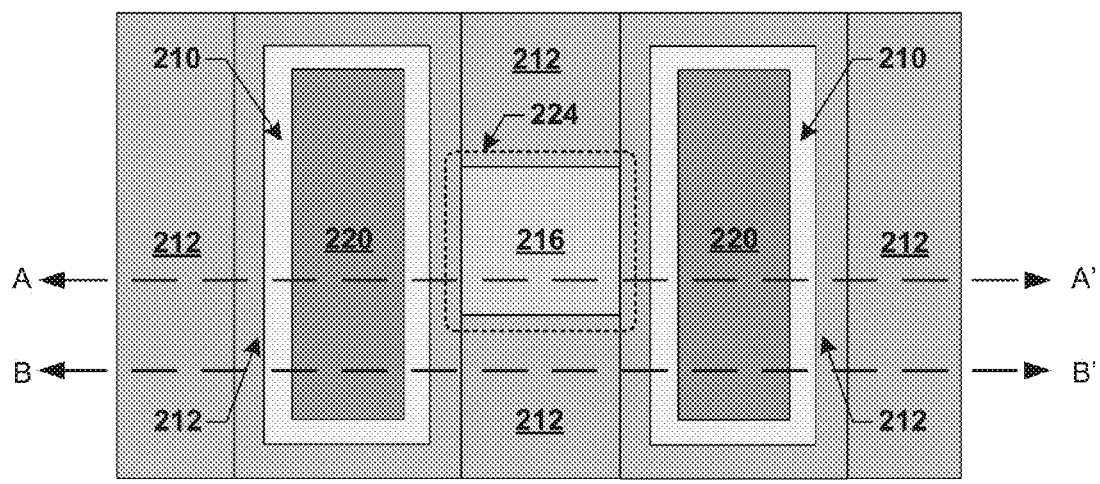
Figure 2Q:
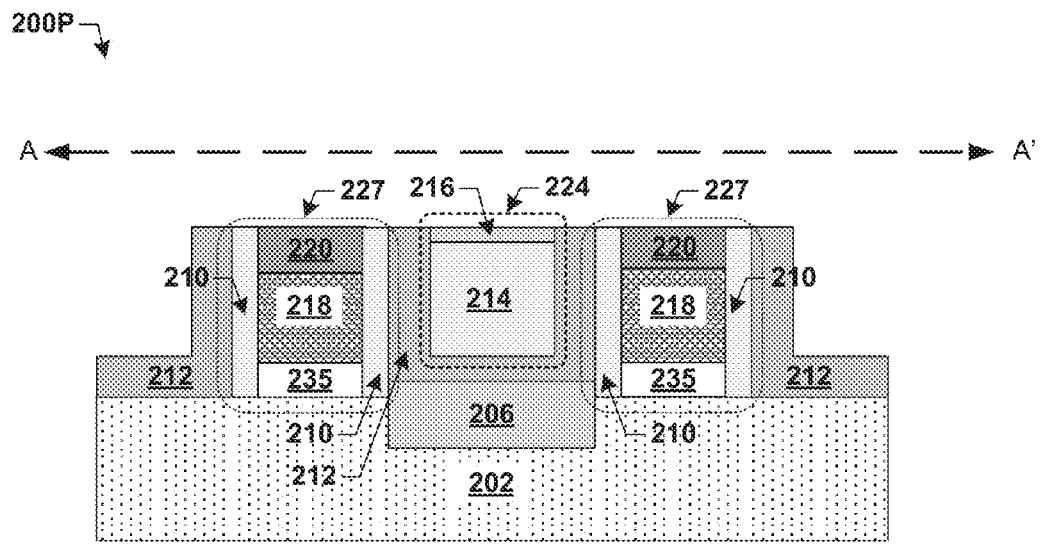
Figure 2R:
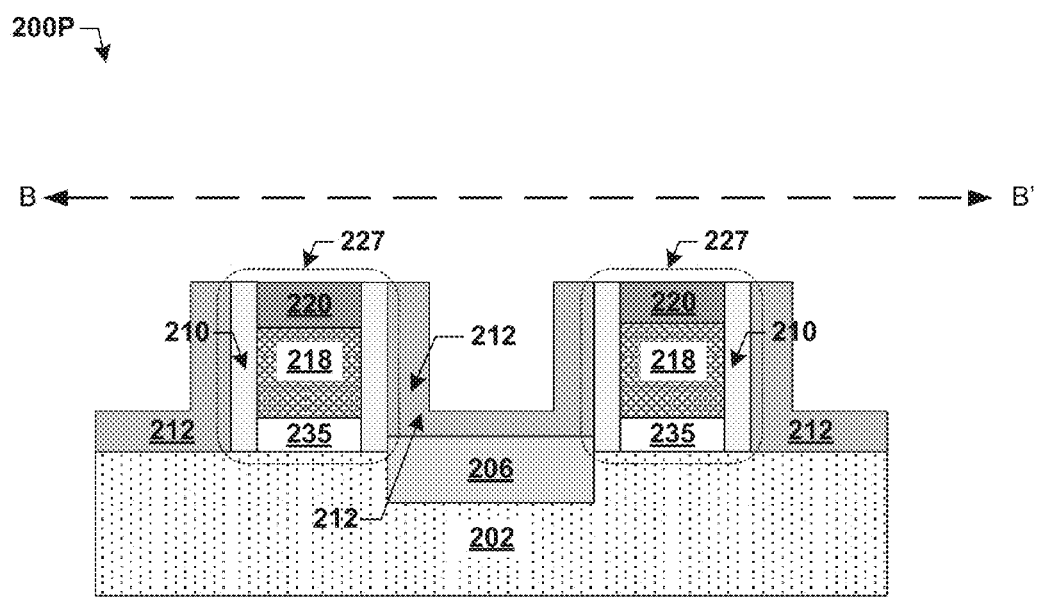
Figure 2S:
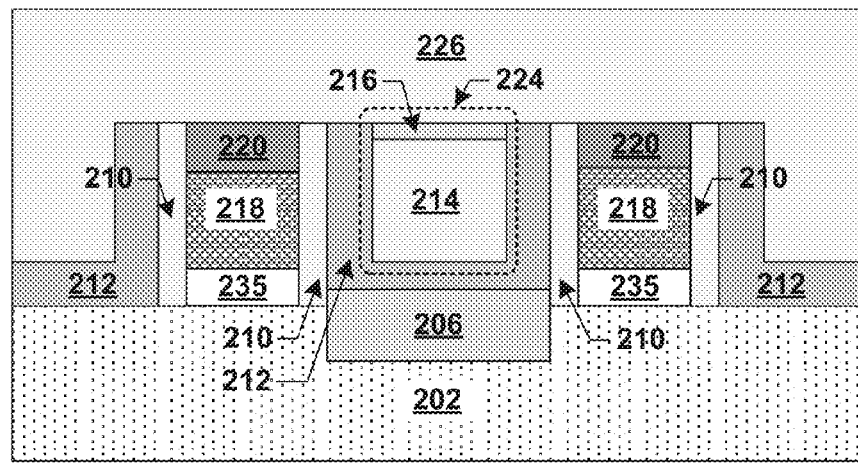
Figure 2T:
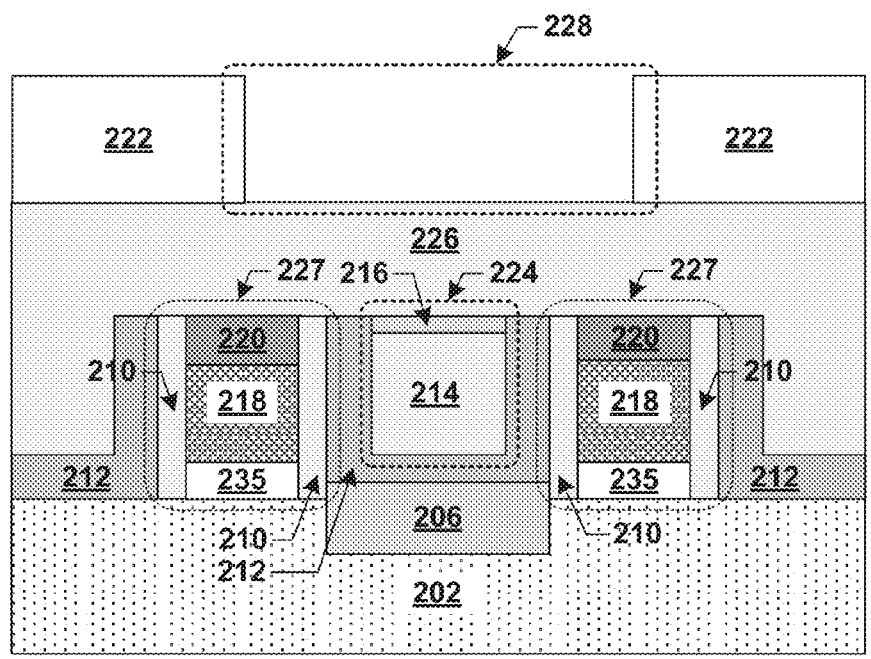
Figure 2U:
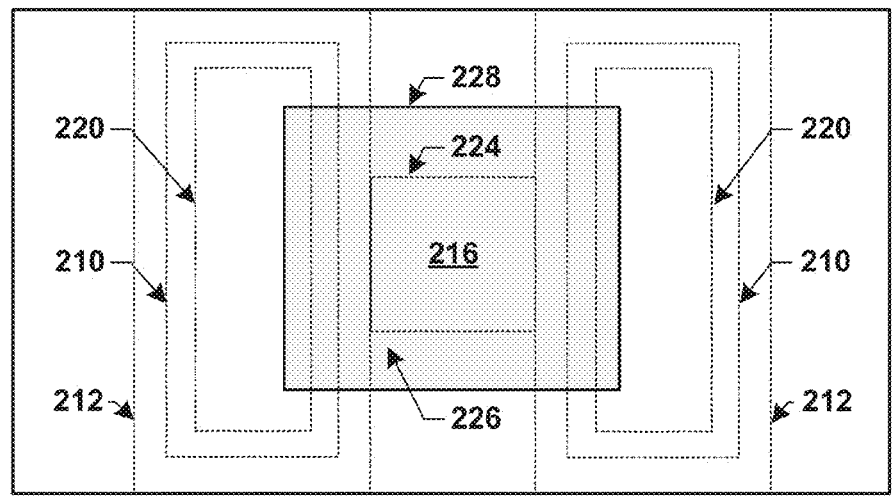
Figure 2V:
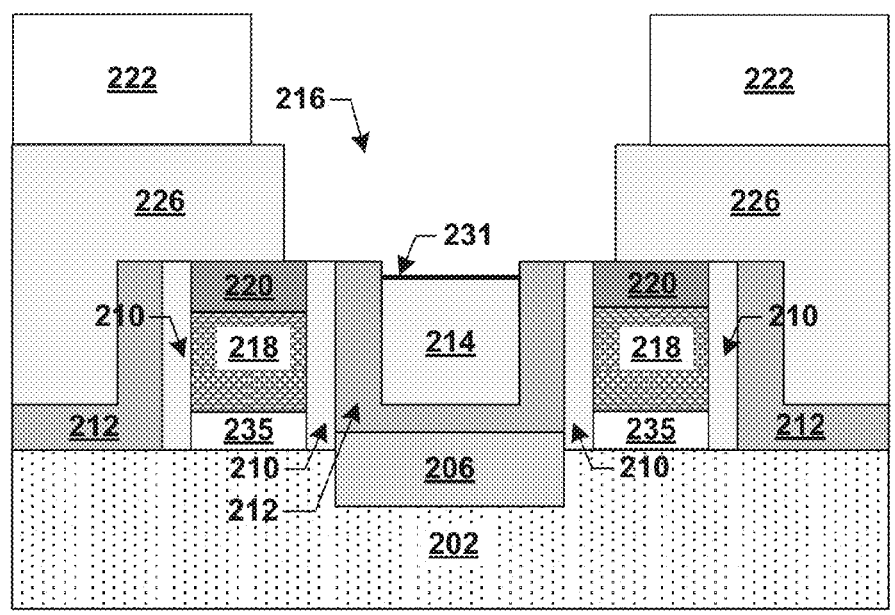
Figure 2W:
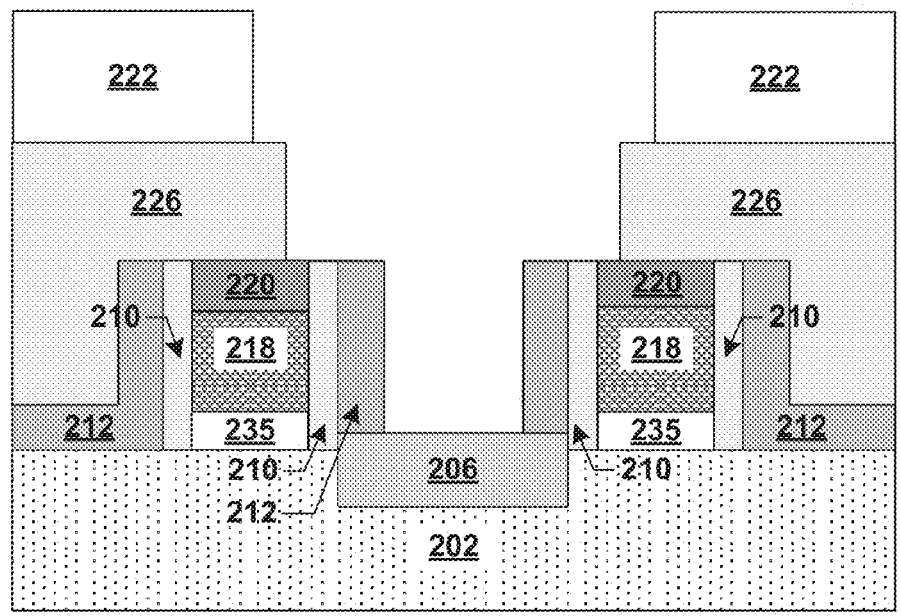
Figure 2X:
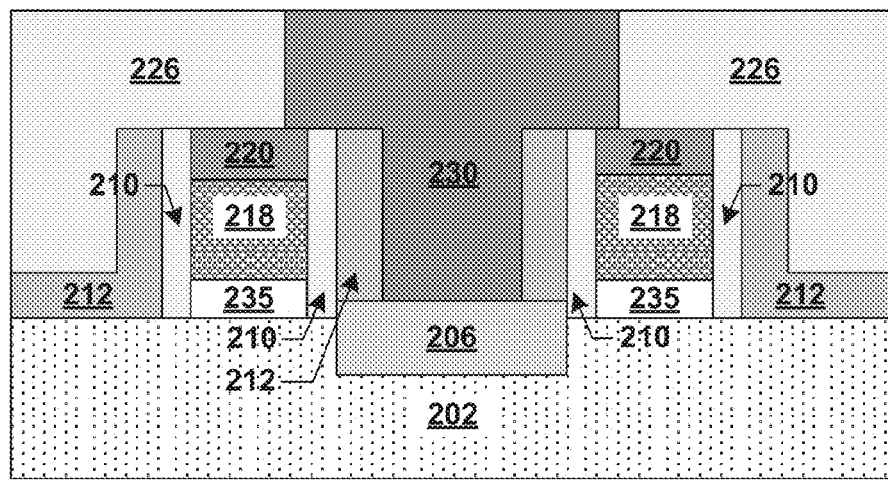

FIGS. 2A-2X illustrate a series of cross-sectional views that collectively depict some embodiments of forming a source/drain contact. FIGS. 2A-2X provide more detailed embodiments of source/drain contact formation over the embodiments of FIGS. 1A-1F.

FIG. 2A illustrates a cross-sectional view of a semiconductor device 200A formed on a surface of a substrate 202. The semiconductor device 200A includes a pair of gate structures 204 formed the surface of the substrate 202. Each gate structure 204 comprises a gate electrode 208 surrounded by sidewall spacers 210 which provide electrical isolation between the gate electrode 208 and a source/drain region 206 of the semiconductor device 200A. In some embodiments, the gate electrodes 208 comprise polysilicon. In some embodiments, the sidewall spacers 210 comprise a dielectric layer. Between the pair of gate structures 204 is the source/drain region 206 of the semiconductor device 200A. In some embodiments, the source/drain region 206 comprises a strained layer formed epitaxially on the surface of a substrate 202. In some embodiments, a lattice constant mismatch between the strained source/drain region 206 and the substrate 202 enhances carrier mobility (e.g., electrons or holes) within the semiconductor device 200A. In some embodiments, the strained source/drain region 206 comprises silicon germanium (SiGe) or silicon phosphide (SiP). In some embodiments, semiconductor device 200A comprises a source/drain region 206 formed on "fin" of a "finned" field-effect transistor (FINFET).

In FIG. 2B, an etch stop material 212 has been formed over the pair of gate structures 204. In some embodiments, the etch stop material 212 comprises silicon-nitride (SiN) with a thickness (t) in a range of about 10 nm to about 100 nm. In some embodiments, a layer of oxide material is formed over the etch stop material 212 to enhance etch selectivity between the oxide material and a sacrificial material 214 formed over the etch stop material 212 in the embodiments of FIG. 2C.

In FIG. 2C, the sacrificial material 214 has been formed over the etch stop material 212. The sacrificial material 214 fills a lateral region 215 over the source/drain region 206 between the pair of gate structures 204. In some embodiments, the sacrificial material 214 includes amorphous silicon (a-Si) formed by atomic layer deposition (ALD), or other appropriate epitaxial technique.

In FIG. 2D, the sacrificial material 214 has been planarized to expose top surfaces 217 of the etch stop material 212. In some embodiments, planarization of the sacrificial material 214 comprises a chemical-mechanical polish (CMP). In some embodiments, the resulting semiconductor device 200D comprises gate structures 204 with a first gate height (h1) in a range of about 50 nm to about 200 nm.

In FIG. 2E, the sacrificial material 214 has been recessed below the top surfaces 217 of the etch stop material 212. In some embodiments, recessing of the sacrificial material 214 comprises an etch comprising an etchant with a high degree of selectivity between the sacrificial material 214 and the etch stop material 212 such that the sacrificial material 214 is etched while the etch stop material 212 remains substantially intact.

In FIG. 2F, an oxide material 216 has been formed over the sacrificial material 214 and the pair of gate structures 204. The oxide material 216 fills a portion of the lateral region 215 vacated by the recessed sacrificial material 214 as well as above the top surfaces 217 of the etch stop material 212. In some embodiments, formation of the oxide material 216 comprises chemical vapor deposition (CVD). In some embodiments, the oxide material 216 comprises tetraethyl orthosilicate (TEOS).

In FIG. 2G, the oxide material 216 has been planarized (e.g., by a first CMP) to expose the top surfaces 217 of the etch stop material 212.

In FIG. 2H, the oxide material 216 and the etch stop material 212 have been planarized (e.g., by a second CMP) to expose the top surfaces 219 of the pair of gate structures 204 (e.g., top surfaces of the gate electrodes 208). The planarization of the oxide material 216 the etch stop material 212 results in gate structures 204 with a second gate height (h2) that is about 100 nm less than the first gate height (h1).

In FIG. 2I, the gate electrodes 208 have been removed to form a pair of cavities 221 within the sacrificial material 214 and oxide material 216.

In FIG. 2J, the pair of cavities 221 have been filled with a gate material 218 that also extends over a top surface 223 of the of the oxide material 216. In various embodiments, the gate material 218 is formed above a dielectric layer 235, and comprises titanium (Ti), nitrogen (N), aluminum (Al), carbon (C), or combinations thereof.

In FIG. 2K, excess gate material 218 has been removed over the top surface 223 of the of the oxide material 216 and partially recessed within the cavities 221 (i.e., between the spacers 210) below the top surface 223 to form gate recesses 225.

In FIG. 2L, an insulating material 220 has been formed within the cavities 221 (i.e., within the gate recesses 225) and over the top surface 223 of the oxide material 216. In some embodiments, the insulating material 220 comprises silicon nitride (SiN).

In FIG. 2M, the insulating material 220 has been planarized (e.g., by a CMP) to expose the top surface 223 of the oxide material 216. The insulating material 220 remains within the cavities above the gate material 218. The spacers 210, remaining gate material 218, and remaining insulating material 220 form a pair of replacement gate structures 227.

In FIG. 2N, a first pattern comprising photoresist (PR) material 222 has been formed over a portion of the sacrificial material 214 224 and oxide material 216 in the lateral region 215 and a portion of each replacement gate structure 227. In some embodiments, the PR material 222 comprises a "trilayer" PR, which includes a carbon-containing layer formed over the top surface 223 of the oxide material 216, a hardmask layer formed over the carbon-containing layer, and a PR layer formed over the hard mask layer. The PR layer is then patterned through photolithography to define the first pattern, and the first pattern is transferred to the hard mask layer and carbon-containing layer.

FIG. 2O illustrates a top-down view of the semiconductor device 200N before an etch of the first pattern 229 formed by the photoresist material 222.

In FIG. 2P, a first etch of the sacrificial material 214 has been performed while using the first pattern 229 of photoresist material 222, the spacers 210, and insulating material 220 as a hard mask to block the first etch. The remaining sacrificial material 214 forms the sacrificial source/drain contact 224. The first etch exposes the etch stop material 212, which is used to prevent a subsequent second etch from etching through the source/drain region (not shown, beneath the etch stop layer 212).

FIG. 2Q illustrates a cross-sectional view of some embodiments of the semiconductor device 200P along cross-section AA' of FIG. 2P to illustrate a cross-section between the pair of replacement gate structures 227 that shows the sacrificial source/drain contact 224 after the first etch.

FIG. 2R illustrates a cross-sectional view of some embodiments of the semiconductor device 200P along cross-section BB' of FIG. 2P to illustrate a cross-section between the pair of replacement gate structures 227 where there is no the sacrificial source/drain contact 224 after the first etch.

In FIG. 2S, a dielectric layer 226 has been formed over the substrate 202. The dielectric layer 226 is configured to electrically isolate the semiconductor device 200S from other components/devices formed on the substrate 202.

In FIG. 2T, a second pattern comprising PR material 222 has been formed that includes an opening 228 over the sacrificial source/drain contact 224 and a portion of each replacement gate structure 227.

FIG. 2U illustrates a top-down view of the semiconductor device 200T. The opening 228 is larger than the sacrificial source/drain contact 224 and also covers a portion of the spacers 210 adjacent the sacrificial source/drain contact 224, and a portion of the etch stop material 212 over each gate electrode (i.e., the gate material 218).

In FIG. 2V, a second etch of the dielectric layer 226 comprising a self-aligned contact etch has been performed through the opening 228 in the second pattern of PR material 222 to expose a top surface 231 of the sacrificial material 214 of the sacrificial source/drain contact 224.

In FIG. 2W, a third etch of the sacrificial material 214 of the sacrificial source/drain contact 224 has been performed. For the embodiments of FIG. 2W, the third etch comprises a dry etch to remove the sacrificial material 214, followed by an ash process to remove the PR material 222 after the dry etch. In some embodiments, the third etch comprises a wet etch, wherein the PR material 222 is removed first by an ash process, followed by the wet etch to remove the sacrificial material 214 of the sacrificial source/drain contact 224. In some embodiments, the wet etch utilizes an etchant that selectively etches the sacrificial material 214 at a substantially higher rate (e.g., in a range of about 5× to about 10×) than the insulating material 220 or spacers 210. In some embodiments, a layer of oxide material is formed over the etch stop material 212 to enhance etch selectivity between the oxide material and a sacrificial material 214 formed over the etch stop material 212 in the embodiments of FIG. 2C.

In FIG. 2X, a self-aligned source/drain contact 230 is formed to the source/drain region 206 by filling a region of the removed sacrificial source/drain contact 224 with a conductive material (e.g., cobalt, copper, or tungsten). FIG. 2X illustrates the profile of the self-aligned source/drain contact 230.

Therefore, in the embodiments of FIGS. 2A-2X, the self-aligned source/drain contact 230 is formed by the first pattern 229 of photoresist material 222, which acts as a hard mask to block the first etch of the sacrificial material 214 over the sacrificial source/drain contact 224. The source/drain contact 230 therefore comprises a "reverse tone" (or negative tone) contact. A reverse tone contact is formed by depositing a layer of material (i.e., the sacrificial material 214), and removing portions of the layer other than the contact itself. The remaining material the forms the contact (i.e., the remaining sacrificial material 214 forms the sacrificial source/drain contact 224). In contrast, a "forward tone" (or positive tone) contact is formed by only removing the portion of the layer where the contact is to be formed. The removed portion of the layer is then filled to form the contact.

Figure 3:
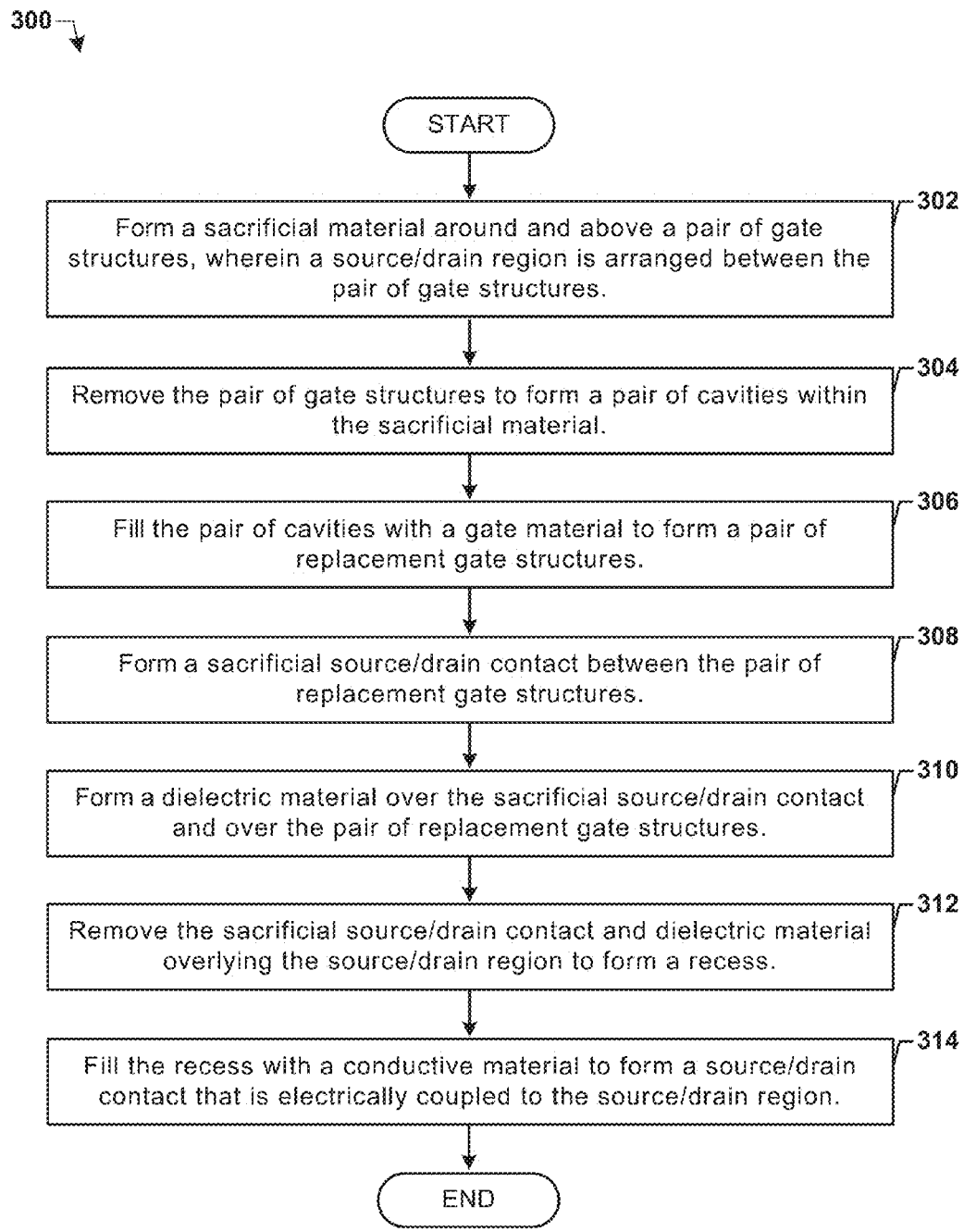
FIG. 3 illustrates some embodiments of a method of forming a source/drain contact.

FIG. 3 illustrates some embodiments of a method 300 of forming a source/drain contact.

At 302 a sacrificial material (e.g., amorphous silicon) is formed around and above a pair of gate structures. A source/drain region is then arranged between the pair of gate structures.

At 304 the pair of gate structures are removed to form a pair of cavities within the sacrificial material.

At 306 the pair of cavities are filled with a gate material to form a pair of replacement gate structures. In some embodiments, removing the pair of gate structures and forming the pair of replacement gate structures further comprises forming insulating sidewall spacers arranged about opposing sidewalls of a sacrificial gate electrode of each gate structure, and forming an etch stop material over the gate electrodes and sidewall spacers prior to forming the sacrificial source/drain contact. The sacrificial gate electrode is then removed to form cavities within vertical surfaces of the sidewall spacers, and the replacement gate structures are formed by filing the cavities with metal.

At 308 a sacrificial source/drain contact is formed between the pair of replacement gate structures.

At 310 a dielectric layer is formed over the sacrificial source/drain contact and over the pair of replacement gate structures.

At 312 the sacrificial source/drain contact and dielectric layer overlying the sacrificial source/drain region are removed to form a recess. In some embodiments, removing the sacrificial source/drain contact and dielectric layer to form the recess comprises a two-step etch, further comprising forming a mask to expose a portion of the dielectric layer over the source/drain region and to cover other portions of the dielectric layer. The two step etch further comprises performing a first etch with the mask in place to remove the exposed portion of the dielectric layer and create a recess within the dielectric layer, wherein the recess terminates at an upper surface of the sacrificial source/drain contact. The two step etch further comprises performing a second etch of the recess to remove the sacrificial source/drain contact and to extend the recess so that it terminates at an upper surface of the source/drain region.

At 314 the recess is filled with a conductive material to form a source/drain contact that is electrically coupled to the source/drain region.

Figure 4:
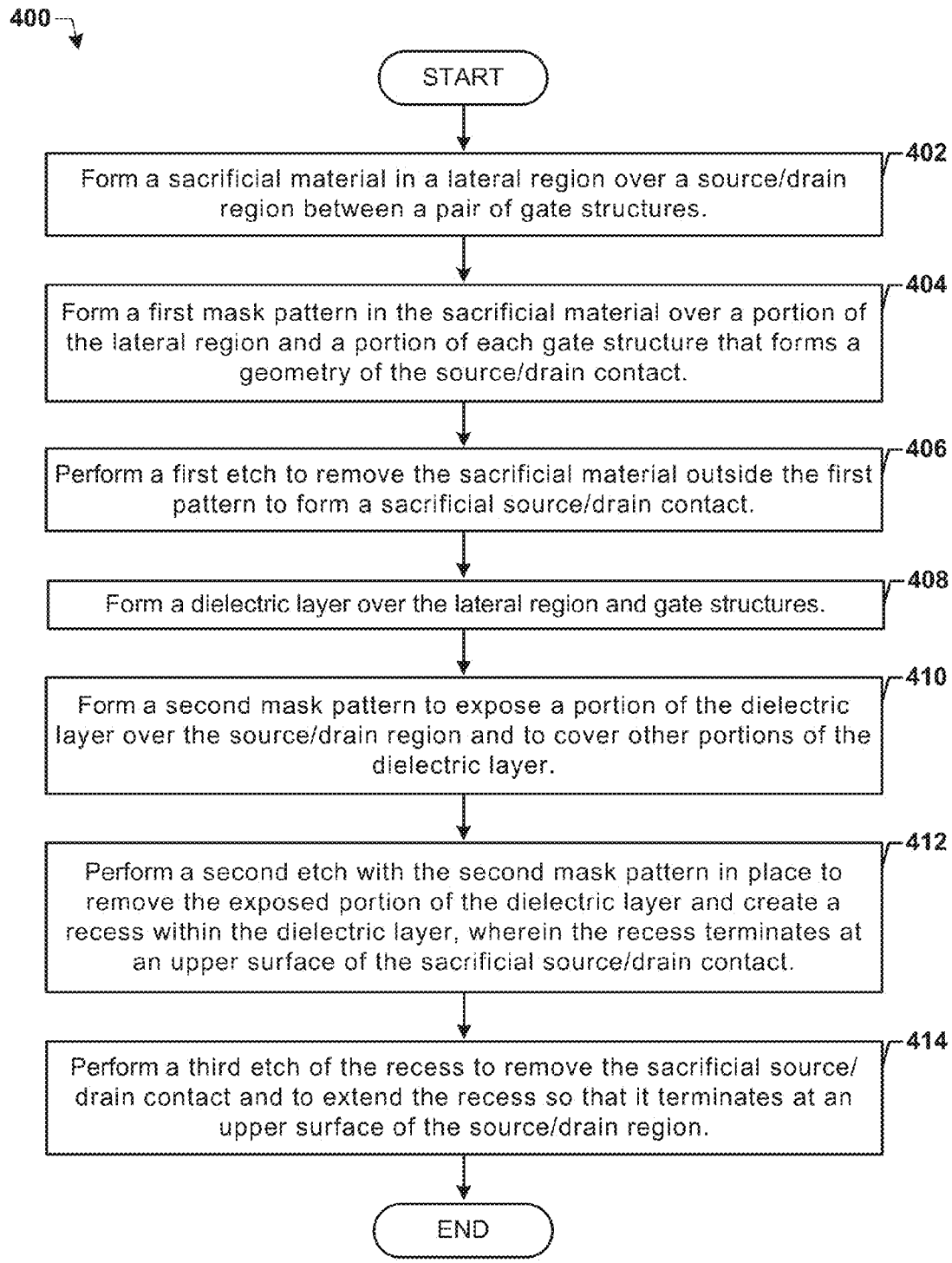
FIG. 4 illustrates some embodiments of a method of forming a source/drain contact.

FIG. 4 illustrates some embodiments of a method 400 of forming a source/drain contact. At 402 a sacrificial material is formed in a lateral region between a pair of gate structures and above the gate structures and lateral region.

At 404 a first mask pattern is formed in the sacrificial material over a portion of the lateral region and a portion of each gate structure that forms a geometry of the source/drain contact. In some embodiments, the first mask pattern comprises photoresist.

At 406 a first etch is performed to remove the sacrificial material outside the first pattern to form a sacrificial source/drain contact.

At 408 a dielectric layer is formed over the substrate.

At 410 a second mask pattern is formed to expose a portion of the dielectric layer over the source/drain region and to cover other portions of the dielectric layer. In some embodiments, the second mask pattern comprises photoresist.

At 412 a second etch is performed with the second mask pattern in place to remove the exposed portion of the dielectric layer and create a recess within the dielectric layer. The recess formed by the second etch terminates at an upper surface of the sacrificial source/drain contact.

At 414 a third etch is performed within the recess to remove the sacrificial source/drain contact and to extend the recess so that it terminates at an upper surface of the source/drain region. In some embodiments, an etch stop material is formed over the pair of gate structures prior to forming the sacrificial source/drain contact. The etch stop material is used to prevent the third etch from etching through the source/drain region. In some embodiments, the gate structure comprises a gate electrode, insulating sidewall spacers arranged about opposing sidewalls of the gate electrode, and a capping layer overlying an upper surface of the gate electrode. In these embodiments, the third etch comprises an etchant with a selectivity between the insulating sidewall spacers, capping layer, and sacrificial material of the sacrificial source/drain contact such that the sacrificial source/drain contact is removed and the insulating sidewall spacers and insulated capping layer are left substantially un-etched.

Therefore, some embodiments of the present disclosure relate to a method to form a source/drain self-aligned contact to a transistor or other semiconductor device. The method comprises forming a pair of gate structures over a substrate, and forming a source/drain region between the pair of gate structures. The method further comprises forming a sacrificial source/drain contact which is arranged over the source/drain region and which is arranged laterally between neighboring sidewalls of the pair of gate structures. The method further comprises forming a dielectric layer which extends over the sacrificial source/drain contact and over the pair of gate structures. The dielectric layer differs from the sacrificial source/drain contact. The method further comprises removing a portion of the dielectric layer over the sacrificial source/drain contact and subsequently removing the sacrificial source/drain contact to form a recess, and filling the recess with a conductive material to form a source/drain contact.

In some embodiments, the present disclosure relates to a method for forming a source/drain contact. The method comprises forming a pair of gate structures on a substrate, and forming a source/drain region between the gate structures. The method further comprises forming a sacrificial source/drain contact which is arranged over the source/drain region and which is arranged laterally between neighboring sidewalls of the gate structures. The method further comprises forming a dielectric layer which extends over the sacrificial source/drain contact and over the gate structures, wherein the dielectric layer differs from the sacrificial source/drain contact. The method further comprises removing a portion of the dielectric layer over the sacrificial source/drain contact and subsequently removing the sacrificial source/drain contact to form a recess, and filling the recess with a conductive material to form a source/drain contact.

In some embodiments, the present disclosure relates to a method for forming a source/drain contact. The method comprises forming a sacrificial material around and above a pair of gate structures, wherein a source/drain region is arranged between the pair of gate structures, and removing the pair of gate structures to form a pair of cavities within the sacrificial material. The method further comprises filling the pair of cavities with a gate material to form a pair of replacement gate structures, forming a sacrificial source/drain contact between the pair of replacement gate structures, and forming a dielectric layer over the sacrificial source/drain contact and over the pair of replacement gate structures. The method further comprises removing the sacrificial source/drain contact and dielectric layer overlying the sacrificial source/drain region to form a recess, and filling the recess with a conductive material to form a source/drain contact that is electrically coupled to the source/drain region.

In some embodiments, the present disclosure relates to a method for forming a source/drain contact. The method comprises forming a sacrificial material in a lateral region between a pair of gate structures and above the gate structures and lateral region. The method further comprises forming a first mask pattern in the sacrificial material over a portion of the lateral region and a portion of each gate structure that forms a geometry of the source/drain contact, and performing a first etch to remove the sacrificial material outside the first pattern to form a sacrificial source/drain contact. The method further comprises forming a dielectric layer over the substrate, forming a second mask pattern to expose a portion of the dielectric layer over the source/drain region and to cover other portions of the dielectric layer. A second etch is then performed with the second mask pattern in place to remove the exposed portion of the dielectric layer and create a recess within the dielectric layer, wherein the recess terminates at an upper surface of the sacrificial source/drain contact. A third etch of the recess is then performed to remove the sacrificial source/drain contact and to extend the recess so that it terminates at an upper surface of the source/drain region.

While methods 100, 300, and 400, have been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a sacrificial material around and above a pair of gate structures, wherein a source/drain region is arranged between the pair of gate structures;
    removing the pair of gate structures to form a pair of cavities within the sacrificial material;
    filling the pair of cavities with a gate material to form a pair of replacement gate structures;
    forming a sacrificial source/drain contact between the pair of replacement gate structures;
    forming a dielectric layer over the sacrificial source/drain contact and over the pair of replacement gate structures;
    sequentially etching both the sacrificial source/drain contact and the dielectric layer to form a recess that extends through the sacrificial material; and
    filling the recess with a conductive material to form a source/drain contact that is electrically coupled to the source/drain region.

2. The method of claim 1, wherein the removing the sacrificial source/drain contact and dielectric layer to form the recess comprises:
    forming a mask to expose a portion of the dielectric layer over the source/drain region and to cover other portions of the dielectric layer;
    performing a first etch with the mask in place to remove the exposed portion of the dielectric layer and create a recess within the dielectric layer, wherein the recess terminates at an upper surface of the sacrificial source/drain contact; and
    performing a second etch of the recess to remove the sacrificial source/drain contact and to extend the recess so that it terminates at an upper surface of the source/drain region.

3. The method of claim 1, wherein the removing the pair of gate structures and forming the pair of replacement gate structures comprise:
    forming insulating sidewall spacers arranged about opposing sidewalls of a sacrificial gate electrode of each of the pair of gate structures;
    forming an etch stop material over the sacrificial gate electrode and sidewall spacers prior to forming the sacrificial source/drain contact;
    recessing the sacrificial gate electrode to form cavities within vertical surfaces of the sidewall spacers; and
    forming the replacement gate structures by filing the cavities with metal.

4. The method of claim 3, further comprising forming a strained source/drain region between the pair of gate structures prior to forming the etch stop material.

5. A method of forming a conductive contact, comprising:
    forming a source/drain region within a substrate;
    forming a first sacrificial gate structure over the substrate at a location laterally offset from the source/drain region;
    depositing amorphous silicon vertically over the source/drain region and latterly adjacent to the first sacrificial gate structure;
    forming a second sacrificial gate structure over the substrate at a location laterally separated from the first sacrificial gate structure by the amorphous silicon;
    replacing the first sacrificial gate structure with a first metal gate structure;
    replacing the second sacrificial gate structure with a second metal gate structure;
    forming a dielectric layer over the amorphous silicon and the first metal gate structure;
    sequentially etching both the dielectric layer and the amorphous silicon to form a recess; and
    filling the recess with a conductive material to form a source/drain contact.

6. The method of claim 5, further comprising:
    forming a second sacrificial gate structure over the substrate at a location laterally separated from the first sacrificial gate structure by the amorphous silicon; and
    replacing the second sacrificial gate structure with a second metal gate structure.

7. The method of claim 5, further comprising:
    forming a layer of etch stop material over the first sacrificial gate structure and the source/drain region; and
    performing a first planarization process that forms a first planar surface comprising the layer of etch stop material and the amorphous silicon.

8. The method of claim 7, further comprising:
    recessing the amorphous silicon below the layer of etch stop material after performing the first planarization process;
    depositing the dielectric layer onto the amorphous silicon after recessing the amorphous silicon, wherein the dielectric layer contacts sidewalls of the layer of etch stop material; and
    performing a second planarization process that forms a second planar surface comprising the layer of etch stop material, the dielectric layer, and the first sacrificial gate structure.

9. A method of forming a conductive contact, comprising:
    forming a pair of sacrificial gate structures over a substrate;
    forming a source/drain region between the pair of sacrificial gate structures;
    forming a sacrificial source/drain contact over the source/drain region and laterally between the pair of sacrificial gate structures;
    replacing the pair of sacrificial gate structures with a pair of metal gate structures;
    forming a dielectric layer over the sacrificial source/drain contact and the pair of metal gate structures, wherein the dielectric layer is laterally offset from the pair of metal gate structures and overlaps the pair of metal gate structures along a vertical direction normal to an upper surface of the substrate;

etching a portion of the dielectric layer over the sacrificial source/drain contact and subsequently etching the sacrificial source/drain contact to form a recess; and filling the recess with a conductive material to form a source/drain contact.

10. The method of claim 9, wherein the removing the sacrificial source/drain contact comprises:

performing a first etch process to etch dielectric layer according to a masking layer to form a opening within the dielectric layer that extends to an upper surface of the sacrificial source/drain contact; and performing a second etch process to etch the sacrificial source/drain contact according to the opening to form the recess, which extends to at an upper surface of the source/drain region.

11. The method of claim 10, wherein the second etch process has an etching selectivity configured to etch the sacrificial source/drain contact faster than the pair of metal gate structures.

12. The method of claim 9, wherein the pair of metal gate structures respectively comprise:

a gate electrode;

insulating sidewall spacers arranged about opposing sidewalls of the gate electrode; and a capping layer overlying an upper surface of the gate electrode.

13. The method of claim 12, wherein the capping layer comprises silicon nitride (SiN).

14. The method of claim 9, wherein the forming the sacrificial source/drain contact comprises:

forming a sacrificial material over the pair of sacrificial gate structures, wherein the sacrificial material fills a lateral region over the source/drain region between neighboring sidewalls of the pair of sacrificial gate structures; and forming the sacrificial source/drain contact by removing the sacrificial material outside the lateral region such that remaining sacrificial material forms the sacrificial source/drain contact.

15. The method of claim 9, wherein the sacrificial source/drain contact and the dielectric layer meet at an interface that lies on a plane, which intersects upper sidewall portions of the pair of metal gate structures.

16. The method of claim 9, wherein the sacrificial source/drain contact comprises amorphous silicon.

17. The method of claim 1, wherein the sacrificial material comprises a 'U' shape that extends along sidewalls of the pair of gate structures.

18. The method of claim 1, further comprising:

removing the pair of gate structures to form the pair of cavities, which contact the sacrificial material.

19. The method of claim 9, further comprising:

forming a sacrificial material around and above the pair of sacrificial gate structures; and wherein the dielectric layer contacts sidewalls of the sacrificial material.

20. The method of claim 19, wherein the dielectric layer has an upper surface aligned with an upper surface of the sacrificial material.

* * * * *